United States Patent
Fischer et al.

(10) Patent No.: US 12,148,640 B2
(45) Date of Patent: *Nov. 19, 2024

(54) METHOD AND APPARATUS FOR USE IN WAFER PROCESSING

(71) Applicant: Infineon Technologies AG, Neubiberg (DE)

(72) Inventors: Thomas Fischer, Villach (AT); Gerald Lackner, Arnoldstein (AT); Walter Horst Leitgeb, Wernberg (AT); Michael Lecher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/160,124

(22) Filed: Jan. 26, 2023

(65) Prior Publication Data
US 2023/0170233 A1 Jun. 1, 2023

Related U.S. Application Data

(60) Division of application No. 17/219,351, filed on Mar. 31, 2021, now Pat. No. 11,637,028, which is a continuation of application No. 16/220,888, filed on Dec. 14, 2018, now Pat. No. 10,985,041, which is a
(Continued)

(51) Int. Cl.
| | |
|---|---|
| *H01L 21/67* | (2006.01) |
| *G01B 11/27* | (2006.01) |
| *H01L 21/66* | (2006.01) |
| *H01L 21/68* | (2006.01) |
| *H01L 21/78* | (2006.01) |

(52) U.S. Cl.
CPC ...... *H01L 21/67259* (2013.01); *G01B 11/272* (2013.01); *H01L 21/681* (2013.01); *H01L 21/78* (2013.01); *H01L 22/20* (2013.01); *H01L 21/67092* (2013.01)

(58) Field of Classification Search
CPC . H01L 21/67259; H01L 21/681; H01L 21/78; H01L 22/20; H01L 21/67092; G01B 11/272
See application file for complete search history.

(56) References Cited

U.S. PATENT DOCUMENTS

| | | |
|---|---|---|
| 5,094,536 A | 3/1992 | MacDonald et al. |
| 7,519,448 B2 | 4/2009 | Ikeda et al. |
| 7,525,593 B2 | 4/2009 | Ichikawa et al. |

(Continued)

FOREIGN PATENT DOCUMENTS

| | | |
|---|---|---|
| CN | 1829897 A | 9/2006 |
| CN | 1975997 A | 6/2007 |

(Continued)

*Primary Examiner* — Julia Slutsker
(74) *Attorney, Agent, or Firm* — Slater Matsil, LLP

(57) ABSTRACT

In an embodiment a method includes placing a wafer on a receptacle comprising a chuck base, wherein a light port for emitting light from a source of light is an opening located in a surface of the chuck base, and wherein the light port is located underneath the wafer, shining the light from the light port at an edge of the wafer so that light passes by the edge of the wafer and processing the wafer on the receptacle based on the light that passed by the edge of the wafer and that is received by a light sensitive element.

19 Claims, 7 Drawing Sheets

Related U.S. Application Data continuation of application No. 14/933,931, filed on Nov. 5, 2015, now Pat. No. 10,186,438.

(56) References Cited

U.S. PATENT DOCUMENTS

| | | | |
|---|---|---|---|
| 8,580,589 B1 | 11/2013 | Hsiao et al. | |
| 8,597,074 B2 | 12/2013 | Farnworth et al. | |
| 9,377,416 B2 | 6/2016 | Maleev et al. | |
| 9,934,957 B2 | 4/2018 | Kozai et al. | |
| 2002/0104229 A1 | 8/2002 | Shin et al. | |
| 2002/0109775 A1* | 8/2002 | White | B23K 26/04 382/141 |
| 2004/0016930 A1 | 1/2004 | Yoshida et al. | |
| 2004/0056216 A1 | 3/2004 | Inenaga et al. | |
| 2006/0222236 A1* | 10/2006 | Osada | H01L 21/681 382/151 |
| 2008/0318395 A1 | 12/2008 | Farnworth et al. | |
| 2009/0004859 A1 | 1/2009 | Kimura et al. | |
| 2009/0233234 A1 | 9/2009 | Shibazaki | |
| 2009/0251699 A1 | 10/2009 | George | |
| 2010/0124610 A1 | 5/2010 | Aikawa et al. | |
| 2011/0157352 A1 | 6/2011 | Liu et al. | |
| 2012/0224945 A1 | 9/2012 | Douki et al. | |
| 2012/0247671 A1 | 10/2012 | Sugawara | |
| 2013/0139950 A1 | 6/2013 | Kannaka et al. | |
| 2013/0280922 A1 | 10/2013 | Lin et al. | |
| 2014/0071437 A1 | 3/2014 | Reich et al. | |
| 2014/0073067 A1 | 3/2014 | Uchida | |
| 2014/0370624 A1 | 12/2014 | Farooq et al. | |
| 2015/0044786 A1 | 3/2015 | Huang et al. | |
| 2015/0228522 A1 | 8/2015 | Lin | |

FOREIGN PATENT DOCUMENTS

| | | | |
|---|---|---|---|
| CN | 101434046 A | 5/2009 | |
| CN | 101740447 A | 6/2010 | |
| CN | 104916560 A | 9/2015 | |
| CN | 106463431 A | 2/2017 | |
| JP | S59125627 A | 7/1984 | |
| JP | S61228642 A | 10/1986 | |
| JP | H0652138 U | 7/1994 | |
| JP | 2008021884 A | 1/2008 | |
| TW | 200908127 A | 2/2009 | |
| TW | 201802916 A | 1/2018 | |
| WO | 0227410 A1 | 4/2002 | |
| WO | WO-2005048340 A1 * | 5/2005 | B28D 5/0094 |

* cited by examiner

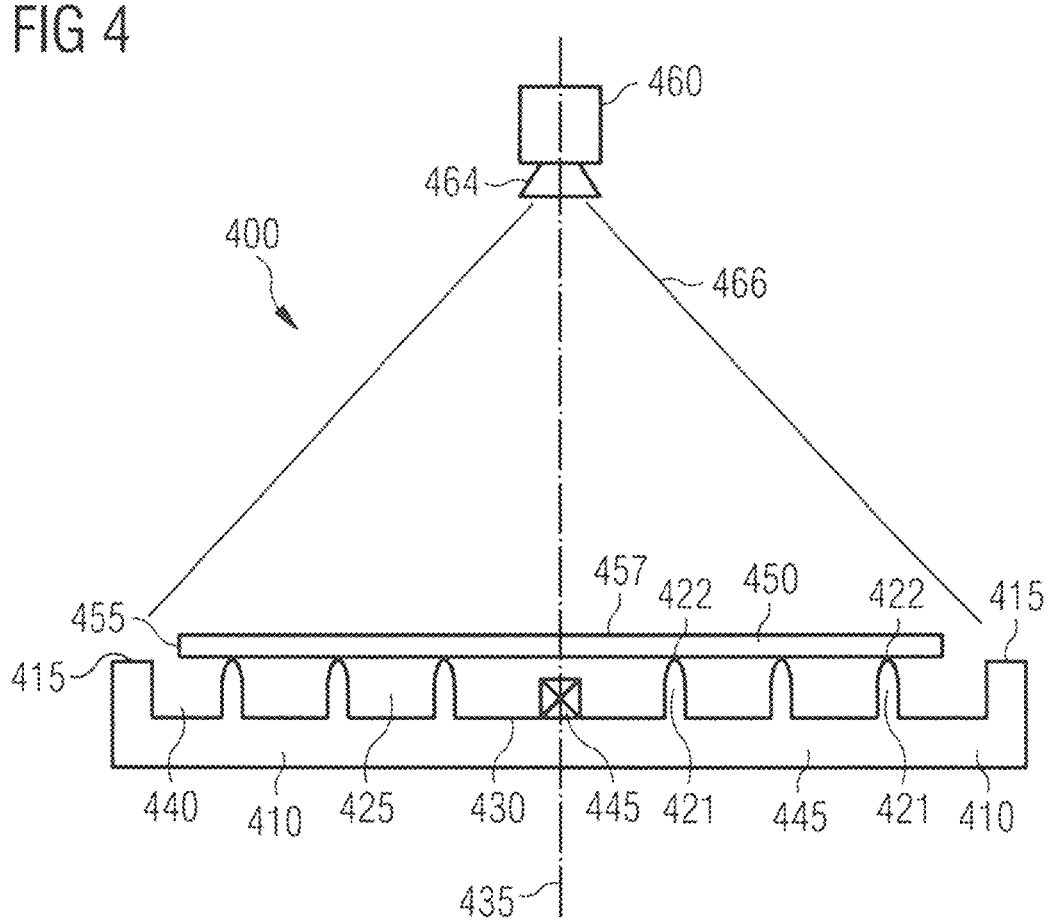

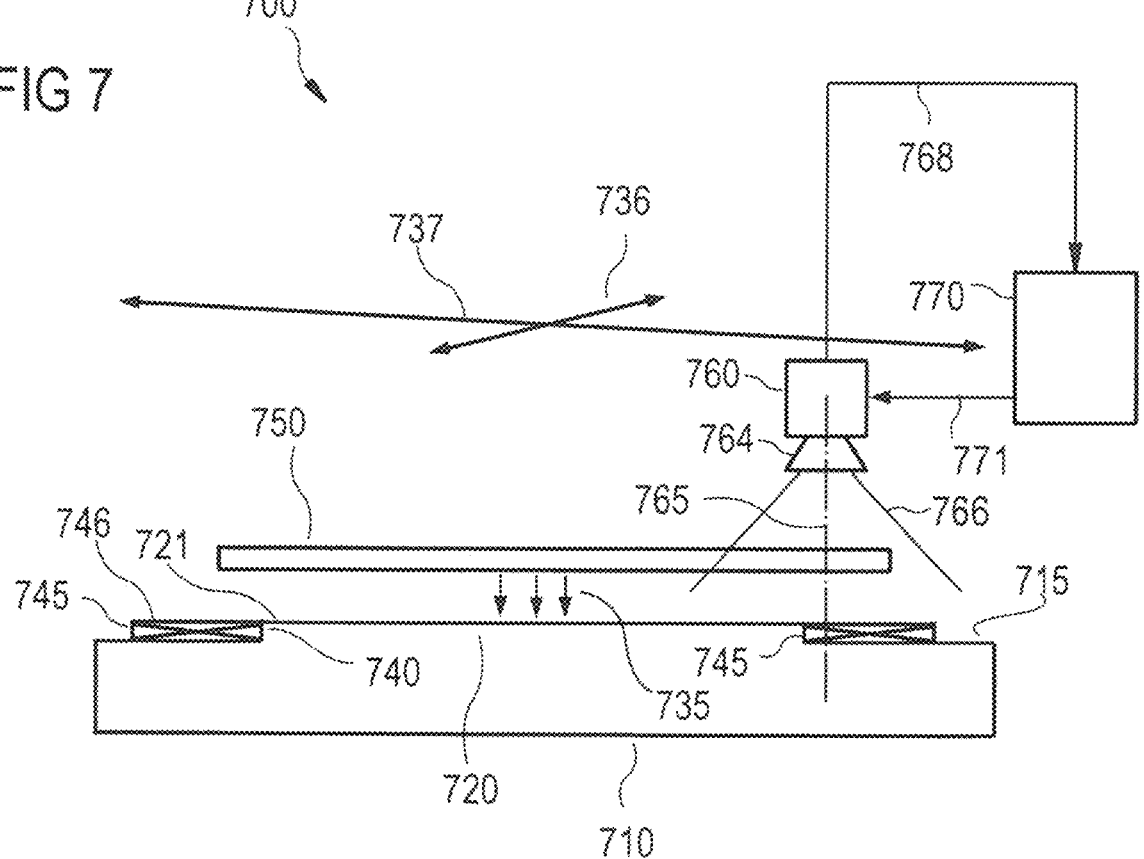

METHOD AND APPARATUS FOR USE IN WAFER PROCESSING

This application is a divisional application of Ser. No. 17/219,351, filed on Mar. 31, 2021, which is a continuation application of U.S. application Ser. No. 16/220,888, filed on Dec. 14, 2018, now U.S. Pat. No. 10/985,041, which issued on Apr. 20, 2021, which is a continuation application of U.S. application Ser. No. 14/933,931, filed on Nov. 5, 2015, now U.S. Pat. No. 10,186,438, which issued on Jan. 22, 2019, which applications are hereby incorporated herein by reference.

TECHNICAL FIELD

The present invention relates to a method and apparatus for an alignment of a wafer for processing.

BACKGROUND

According to some solutions, prior to transfer onto a chuck, a wafer is pre-aligned. Then, the wafer is transferred onto a chuck where it is rotated while a radial distance from wafer edge to a center of the chuck is measured. A sequence of these radial measurements is used to determine a centration of the wafer on the chuck, its translational position, and the location of flats or notches on its periphery which defines its rotational orientation, herein also referred to as a polar position. The movement of the chuck assures rotational alignment, and a mechanism that then transfers the wafer to a workspace compensates for its translational misalignment. In this way, pre-aligners typically are able to align the wafer to within a degree of rotation and a few thousandths of an inch in translation. Ultimately, pre-alignment accuracy in knowing where die are located relies on the precision of the pre-aligner, the precision of the wafer transport mechanism and the precision with which die are placed on the wafer. With modern photolithography, device locations can repeat from wafer to wafer to within a few thousandths of an inch.

SUMMARY

In an aspect, a method is disclosed herein that is provided for use in processing a wafer. The method comprises providing the wafer on a receptacle and shining a light on an edge of the wafer. Further, the method comprises, based on light that passed the edge of the wafer, processing the wafer on the receptacle.

In another aspect, an apparatus for use in processing a wafer is disclosed. The apparatus comprises a receptacle configured to receive the wafer during a processing act. The apparatus comprises a light sensitive element configured to form a detection signal based on light that passed by an edge of the wafer to hit the light sensitive element.

BRIEF DESCRIPTION OF THE DRAWINGS

FIG. 4 is a diagram that illustrates a sectional side view of a processing apparatus according to some embodiments;

FIG. 7 is a diagram that illustrates a sectional side view of a processing apparatus according to some embodiments.

Figure 1:
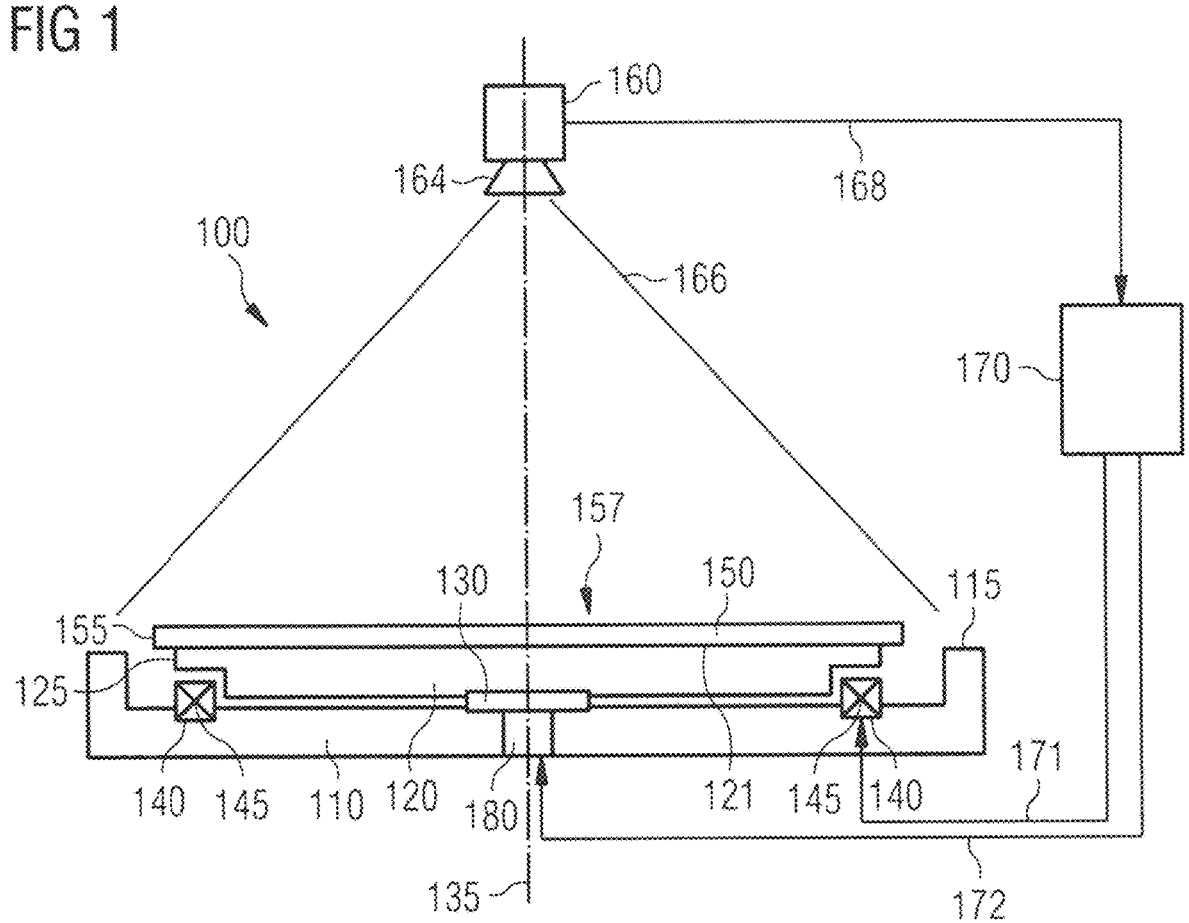
FIG. 1 is a diagram that illustrates a sectional side view of a processing apparatus according to some embodiments.

Below, embodiments, implementations and associated effects are disclosed with reference to the drawings. The elements of the drawings are not necessarily to scale relative to each other. Like reference numerals designate corresponding similar parts. Because components of embodiments according to the present invention can be positioned in a number of different orientations, directional terminology may be used for purposes of illustration that, however, is in no way limiting, unless expressly stated to the contrary. Other embodiments according to the present invention and many of the intended advantages of the present invention will be readily appreciated as they become better understood by reference to the following detailed description. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION OF ILLUSTRATIVE EMBODIMENTS

FIG. 1 is a diagram that illustrates a sectional side view of a processing apparatus 100 according to some embodiments. Processing apparatus 100 comprises a chuck base 110 and a turntable 120. Processing apparatus 100 comprises a bearing 130 configured to bear turntable 120 on chuck base 110. In some embodiments, chuck base 110 has a rim 115 that, in some implementations approximately in a plane with a surface 121 of turntable 120, surrounds turntable 120.

In some embodiments, processing apparatus 100 comprises a drive unit 180. In some implementations, drive unit 180 is configured to receive a control signal and, based on the control signal, to move turntable 120. In some embodiments, turntable 120 is provided with a drive unit 180 configured to rotate turntable 120 relative to chuck base 110 about a drive rotation axis 135 that, in some embodiments, is essentially vertical. In some implementations, drive unit 180 is configured to laterally move turntable 120 relative to chuck base 110.

Turntable 120 is provided with surface 121 configured to support a workpiece. A peripheral portion of turntable 120 forms a protrusion 125 that partially covers a portion of a peripheral recess 140 provided by chuck base 110. In some embodiments, peripheral recess 140 houses a source of light 145. For example, peripheral recess 140 houses a light emitting diode.

Further, processing apparatus 100 comprises a camera 160 having a lens system 164 with a field of view 166. In some embodiments, an axis of lens system 164 is essentially collinear with drive rotation axis 135. In some implementations, camera 160 comprises an image sensor and is configured to output a detect signal representative of light sensed by the image sensor. In some embodiments, the image sensor is provided as a charge coupled device that is configured to output an image signal as a detect signal.

In some implementations processing apparatus 100 comprises, or is coupled to, a control unit 170. More particularly, control unit 170 is selectively coupled to other components of processing apparatus 100. For example, control unit 170 is coupled, via a detect signal link 168, to camera 160. In some embodiments, control unit 170 is coupled, via a first control signal link 171, to source of light 145. Further, in some implementations, control unit 170 is coupled, via a second control signal link 172, to drive unit 180. As will be described in more detail below, in some embodiments control unit 170 is configured to receive the detect signal from camera 160, process the detect signal to derive a first control signal and to transmit the first control signal to source of light 145. In some embodiments, control unit 170 is configured to derive, based on the detect signal, a second control signal and to transmit the second control signal to drive unit 180.

Figure 2:
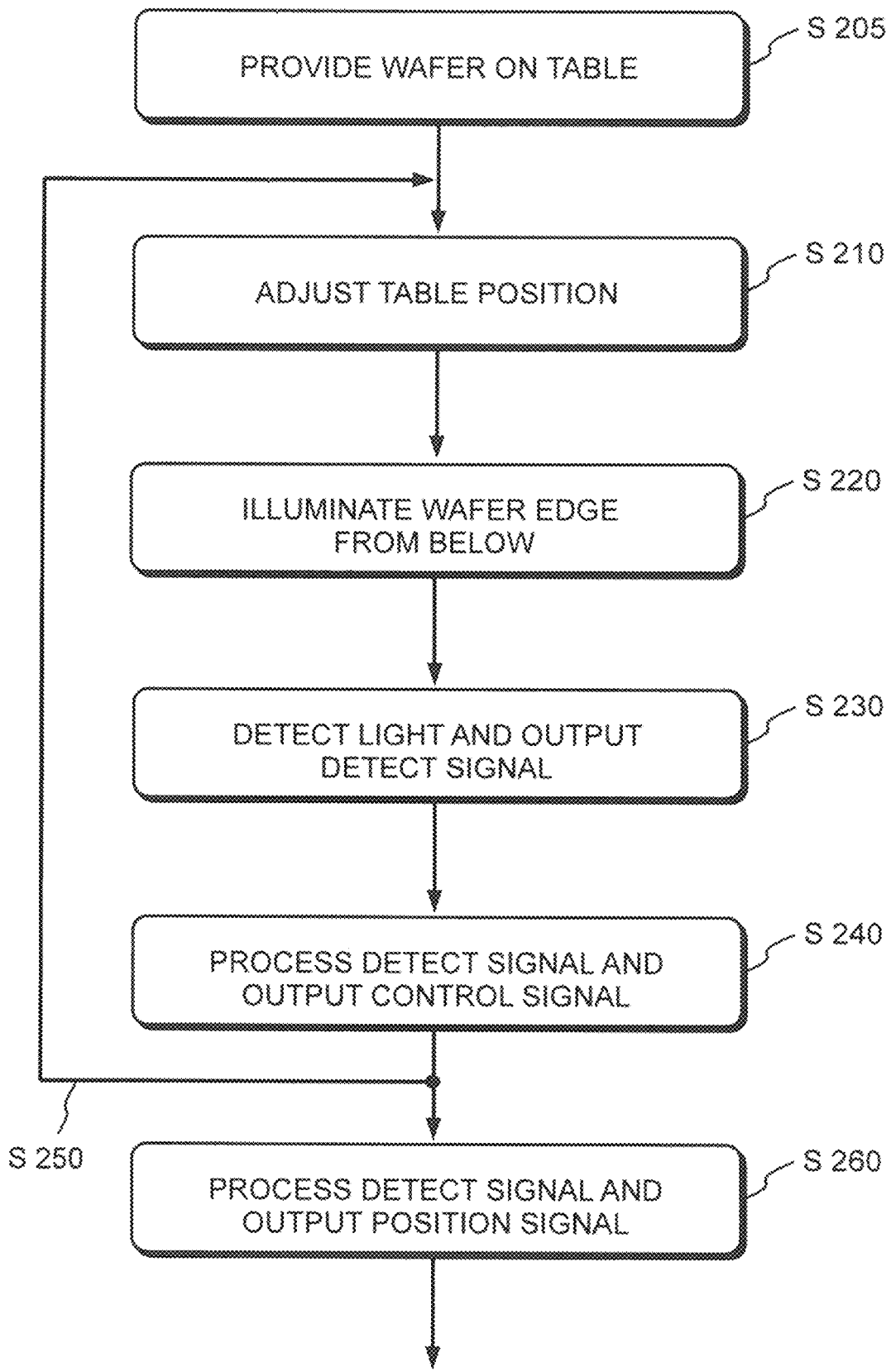
FIG. 2 is a diagram that illustrates a flow chart that representing acts performed in a method according to some embodiments.

Now, use of processing apparatus 100 according to some implementations will briefly be described with respect to FIG. 2 which is a diagram that illustrates a flow chart that represents acts performed in a method according to some embodiments.

At S205, a workpiece is provided on surface 121 of table 120. In some implementations, the workpiece can, for example, be a wafer 150 such as a silicon wafer that is used in manufacturing semiconductor devices. In some implementations, an edge portion 155 of wafer 150 can radially extend beyond protrusion 125 of turntable 120, while a top surface 157 of wafer 150 faces lens system 164 of camera 160.

In some implementations, at S210, drive unit 180 is operated to adjust a position of turntable 120. In some embodiments, drive unit 180 moves turntable 120 with wafer 150 laterally with respect to chuck base 110. In some implementations, drive unit 180 rotates turntable with wafer 150 with respect to chuck base 110.

At S220, control unit 170 controls source of light 145 so as to illuminate peripheral recess 140. Light from source of light 145, some directly and some indirectly, in particular by reflection at a wall surface of peripheral recess 140, illuminates edge portion 155 of wafer 150. In particular, however, at least according to some implementations, no, or at least comparatively little, light from source of light 145 hits top surface 157 of wafer 150.

At S230, camera 160 detects light, for example, by using the charge coupled device comprised in camera 160, and outputs an image signal as a detect signal onto detect signal link 168 for transmission to control unit 170.

At S240, control unit 170 receives the image signal and processes the image signal. In some implementations, processing of the image signal generates at least a first control signal for use in control of light source 145. In some implementations, control unit 170 generates the second control signal based on the orientation information. In some implementations, processing of the image signal generates at least a second control signal for use in control of drive unit 180. In some implementations, control unit 170 generates the second control signal based on orientation information about an orientation of wafer 150 about drive rotation axis 135 and relative to chuck base 110.

In some implementations, at S250, control unit 170 transmits the first control signal, via first control signal link 171, to source of light 145. For example, the first control signal can represent a flag indicative of a switch operation such as an instruction to switch on source of light 145 or an instruction to switch off source of light 145.

In some implementations, at S250, control unit 170 transmits the second control signal, via second control signal link 172, to drive unit 180. For example, the second control signal can represent a flag indicative of a switch operation such as an instruction to switch on drive unit 180 or an instruction to switch off drive unit 180.

At S260, based on the image signal, according to some implementations, control unit 170 generates position data that represent information on a position of wafer 150, for example, with reference to chuck base 110. In some implementations the generating comprises calculation of position coordinates and/or angles. In some implementations the generating comprises submitting a plurality of measurement data to a statistical analysis. Position information, in some embodiments, comprises a lateral position with respect, for example, to drive rotation axis 135. Position information, in some embodiments, comprises orientation information of wafer 150 about drive rotation axis 135. In some embodiments, position information comprises both, lateral position and rotational position. In some implementation, the position information is used in order to align any tool or mask according to the position of wafer 150, for example, for use in subsequent wafer processing acts.

It should be understood that a sequence of acts described above with respect to FIG. 2 can be different according to different implementations. For example, in some implementations, act S260 is performed prior to some or all of act S250, i.e., prior to transmission of the first control signal from control unit 170 to the source of light 145 and/or prior to transmission of the second control signal from control unit 170 to drive unit 180.

In some implementations, some of the acts described above with reference to FIG. 2 are essentially performed simultaneously. For example, in some implementations, once the source of light 145 is switched on, at least during an interval of time used for alignment of wafer 150, act S220 is continuously performed, i.e., wafer 150 is continuously illuminated. At the same time, light is continuously detected, i.e., act S230 is continuously performed. In some implementations, control unit 170 receives a stream of data representing an image signal that represents a sequence of images. In some embodiments, control unit 170, for each image, generates the first and/or the second control signal. Thus, in effect, act S240 is continuously performed. In some implementations, control unit 170 essentially continuously transmits the first and/or the second control signal, whereby act S250 is essentially continuously performed. In some implementations, position data are continuously generated, i.e., some or all of act S260 is continuously performed. In other implementations, a plurality of alignment intervals is used to perform at least some of the above-described acts simultaneously at least during selected intervals of the plurality of alignment intervals. An interval length, in some embodiments, is predetermined. In some embodiments, the length of the interval is flexible. For example, in some embodiments the interval ends after a predetermined criteria is met. In some implementations, for example, the predetermined criteria is an error in position measurement resulting from a statistical analysis of data points generated by previous measurements having fallen below a predetermined error interval.

Figure 3A:
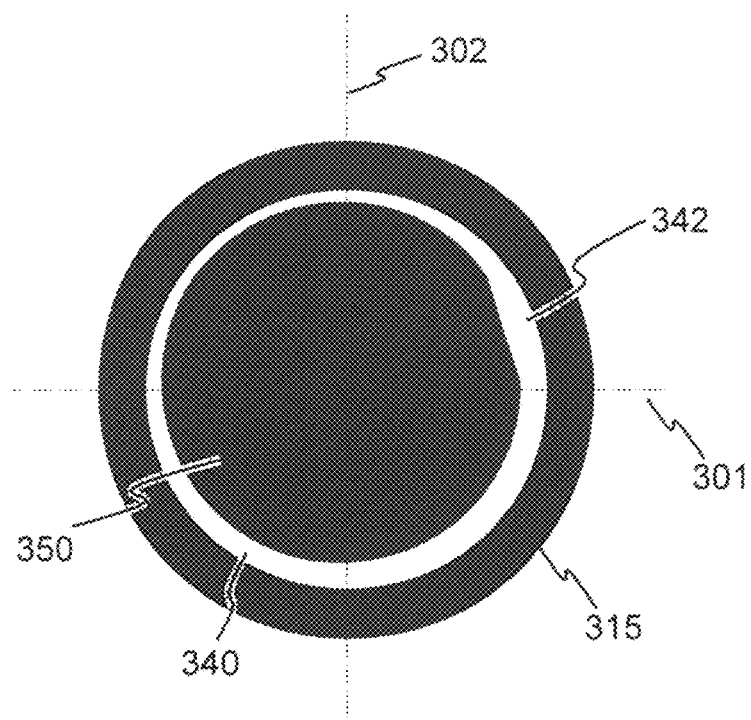
FIG. 3A is a schematic representation of an exemplary first image taken in use of a processing apparatus according to some embodiments.

FIG. 3A is a schematic representation of an exemplary first image seen in use of processing apparatus 100 according to some embodiments. The first image, in some implementations could, for example, be taken by camera 160 during an interval, when, at S220, source of light 145 is switched on to illuminate peripheral recess 140 of chuck base 110. Light from source of light 145 gets reflected by the wall surface of peripheral recess 140 and illuminates edge portion 155 of wafer 150 to throw a shadow. Thus, in some implementations, for lack of any other source of light, wafer 150 throws a shadow that, in the first image detected at camera 16o, appears as a dark field 350. However, some light from source of light 145 gets reflected by the wall surface of peripheral recess 140 to then pass edge portion 155 of wafer 150 and hit lens system 164 of camera 160 where, in some implementations, the light hits a charge coupled device or other light sensitive element. The charge coupled device thus detects light that passed wafer 150, wherein the detected light forms an image of a bright ring 340. Further, for lack of any illumination of a top surface of rim 115, rim 115, at camera 160 is seen as a dark ring 315 that surrounds bright ring 340 and dark field 350 and whose diameter fits within the field of view 166 of camera 160.

Still looking at FIG. 3A, a co-ordinate system having orthogonal axes 301 and 302 is shown that is concentric to dark ring 315, i.e., the shadow associated with chuck rim 115. A contrast between light that passed edge portion 155 of wafer 150 and a shadow thrown by wafer 150, in particular by edge portion 155 of wafer 150, is particular sharp. At least one effect is that a position of wafer 150 relative to a rim 115 of chuck base 110, based on the first image, can be determined more precisely than in a case where a top surface of wafer 150 is illuminated in order to detect light reflected from the top surface. In a case, where wafer 150 lacks rotational symmetry, for example, in the case depicted in FIG. 3A, where wafer 150 is of essentially circular shape whose rotational symmetry, albeit, is broken by a flat, based on the first image detected at camera 160, a rotational position of wafer 150 can also more precisely be determined. The flat is identified precisely at a correspondingly "flat" portion 342 of bright ring 340 where a width of bright ring 340 with changing polar angle characteristically first rises to a maximum width and then falls. In some embodiments, processing of data of the first image can generate control signals for use in control, for example, of drive unit 180.

Figure 3B:
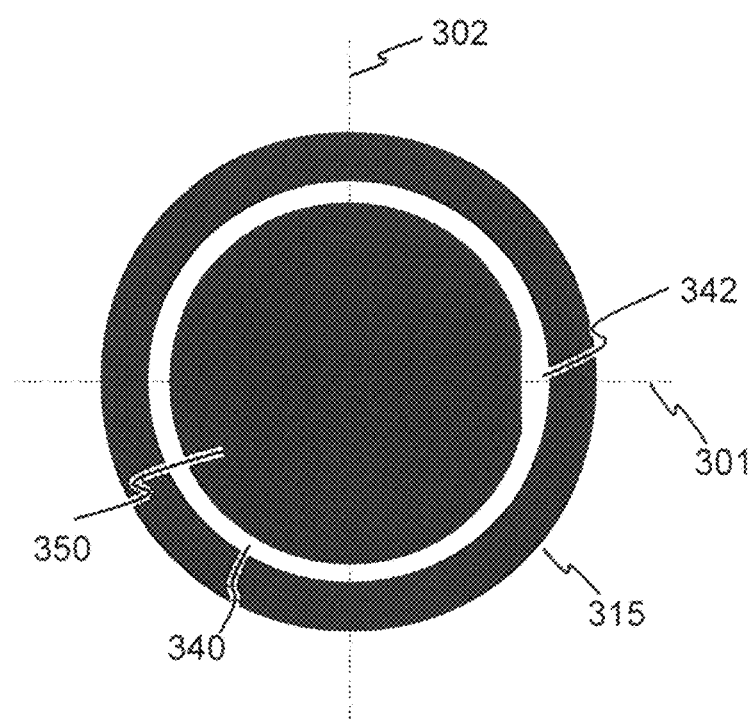
FIG. 3B is a schematic representation of an exemplary second image taken in use of a processing apparatus according to some embodiments.

FIG. 3B is a schematic representation of an exemplary second image seen in use of processing apparatus 100 according to some embodiments. More particularly, in some implementations, drive unit 180 receives the control signals and accordingly moves turntable 120 into a predetermined alignment position where wafer 150 is positioned, for example, with a centre on-axis with drive rotation axis 135. Further, the flat can be rotated into a predetermined position, for example, as in the example shown in FIG. 3B, into a "3o'clock position". As described above, in some embodiments camera 160 takes a plurality of images and submits image data that represent the image to control unit 170 for processing. In some implementations, for example, at a time, for example, when an error of position has fallen below a predetermined error ceiling, control unit 170 provides a switch off signal to source of light 145 and/or to camera 160 to end alignment of wafer 150. In some implementations, apparatus 100 then proceeds to work wafer 150. For example, apparatus 100 sets a cutting tool to wafer 150 so as to cut of burr from wafer edge 155. For another example, apparatus 100 sets a cutting tool to wafer 150 so as to cut away a lost carrier ring from wafer edge 155. The position of wafer 150 and/or the orientation of wafer 150 relative to chuck base 110, in other words the rotational position of wafer 150, are determined and, in some embodiments, the wafer is also aligned according to some implementations in accordance with predetermined alignment requirements. At least one effect according to some embodiments is pre-alignment of wafer 150 can be omitted. Thus, time may be saved. Also, space may be saved since, at least in some implementations, a pre-alignment tool may not be needed. This effect can be of particular importance since wafer processing typically takes place in a clean room where space is scarce.

It should be understood that the positions and shapes described herein, meanwhile, are merely to state an example. Neither does the shape of the wafer need to be essentially circular, nor do the positions need to be selected as described herein. For example, the wafer could have a rectangular shape or an arbitrary shape that does not correspond to any simple geometrical shape such as rectangle, triangle and circle. A position of a centre such as a "weight" centre of wafer 150 could be predetermined to be located out of axis from drive rotation axis 135. In accordance with the concept underlying the techniques disclosed herein, however, at least three portions of edge 155 of wafer 150 are provided above recess 140 to detect a corresponding shadow that fits a contour of wafer 150 and, in some implementations, enables a calculation of a position of wafer 150 that is consistent, in some cases uniquely consistent, with the detected image.

FIG. 4 is a diagram that illustrates a sectional side view of a processing apparatus 400 according to some embodiments. Processing apparatus 400 comprises a chuck base 410 and a pillar field 420. Pillar field 420 comprises a plurality of pillars 421 in a space 425 above field floor 430. In some embodiments, pillars 421 are approximately evenly spaced apart from one another. In some embodiments, pillars 421 have, at a top, a tip 422 configured to support a workpiece. In some implementations, pillars 421 of pillar field 420 are provided such that tip 422 of each pillar 421 is located in a common plane. In some implementations the plane is horizontal. At least one effect is that a flat workpiece such as a wafer 450 can be evenly supported on pillars 421 of pillar field 420. In some implementations, pillars 421 are provided with an opening (now shown) in tip 422 that is coupled to a pressure unit (not shown) configured to vary a pressure at the opening. At least one effect can be that a workpiece such as a wafer 450, by applying a low pressure, can be sucked towards pillars 421, whereby a resistance, for example, against lateral movement of wafer 450, is increased. At least one other effect can be that a workpiece such as wafer 450, by applying a high pressure, can be lifted above pillars 421, whereby a pickup of the wafer 450 and/or lateral movement of wafer 450 may be facilitated. In a variant (not illustrated), instead of the pillar field, the processing apparatus can comprise a table similar to table 120 of processing apparatus 100 illustrated in FIG. 1, but having openings in a surface coupled to a pressure system configured to selectively apply a high pressure and low pressure, whereby a workpiece provided atop the table is either sucked to the table or lifted above the table.

In some embodiments, pillar field 420 comprises at least one source of light 445. For example, pillar field 420 comprises a light emitting diode. In some embodiments (not shown), selected pillars 421 of pillar field 420 include the source of light. In some implementations, all pillars 421 of pillar field 420 include a respective source of light 445.

Further, processing apparatus 400 comprises a camera 460 having a lens system 464 with a field of view 466. In some embodiments, an axis 435 of lens system 464 is essentially perpendicular to a plane common to tips 422 of pillars 421. In some implementations, camera 460 comprises an image sensor and is configured to output a detect signal representative of light sensed by the image sensor. In some embodiments, the image sensor is provided as a charge coupled device that is configured to output an image signal as a detect signal.

In some implementations processing apparatus 400 comprises, or is coupled to, a control unit (not shown). More particularly, the control unit is selectively coupled to other components of processing apparatus 400. For example, the control unit may be coupled, via a detect signal link, to camera 460. In some embodiments, the control unit is coupled, via a first control signal link, to source of light 445. Further, in some implementations, the control unit is coupled, via a second control signal link, to the pressure unit. In some embodiments, the control unit is configured to receive the detect signal from camera 460, process the detect signal to derive a first control signal and to transmit the first control signal to source of light 445. In some embodiments, the control unit is configured to derive, based on the detect signal, a second control signal and to transmit the second control signal to the pressure unit.

In some implementations, operation of processing apparatus 400, in essence, is performed similar to operation of processing apparatus 100. However, instead of operating a drive unit, in processing apparatus 400 the pressure unit is operated in order to provide a low pressure whereby wafer 450 is affixed atop pillars 421 of pillar field 420. Further the pressure unit is operated to release wafer 450 from a fixation atop pillars 421 so as to enable a removal of wafer 450 from processing apparatus 400. Use of processing apparatus 400 according to some implementations will briefly be described, again with reference to FIG. 2.

At S205, a workpiece is provided on pillars 421 of pillar field 420. In some implementations, the workpiece can, for example, be a wafer 450 such as a silicon wafer that is used in manufacturing semiconductor devices. In some implementations, an edge portion 455 of wafer 450 radially extends above a part of space 425 provided with pillars 421, while a top surface 457 of wafer 450 faces lens system 464 of camera 460.

In some implementations, at S210, the pressure unit is operated to provide a low pressure and, thus, to affix wafer 450 in a position relative to chuck base 410.

At S220, the control unit controls source of light 445 so as to illuminate pillar field 420 in the space 425 provided between pillars 421. Light from source of light 445, some directly and some indirectly, in particular by reflection at a wall surface of a peripheral portion 440 of chuck base 410, illuminates edge portion 455 of wafer 450. In particular, however, at least according to some implementations, no, or at least comparatively little, light from source of light 445 hits top surface 457 of wafer 450.

At S230, camera 460 detects light, for example, by using the charge coupled device comprised in camera 460, and outputs an image signal as a detect signal onto the detect signal link for transmission to the control unit (not shown in FIG. 4).

At S240, the control unit receives the image signal and processes the image signal. In some implementations, processing of the image signal generates at least a first control signal for use in control of light source 445. In some implementations, the control unit generates the second control signal based on the orientation information. In some implementations, processing of the image signal generates at least a second control signal for use in control of the pressure unit. In some implementations, the control unit generates the second control signal based on orientation information about an orientation of wafer 450 about an axis that, for example, meets a centre of wafer 450 and is parallel to axis 435 of lens system 464 and relative to chuck base 410.

In some implementations, at S250, the control unit transmits the first control signal, via the first control signal link, to source of light 445. For example, the first control signal can represent a flag indicative of a switch operation such as an instruction to switch on source of light 445 or an instruction to switch off source of light 445.

In some implementations, at S250, the control unit transmits the second control signal, via the second control signal link, to the pressure unit. For example, the second control signal can represent a flag indicative of a switch operation such as an instruction to switch on pressure unit, for example, to create a low pressure whereby wafer 450 is affixed atop pillar field 420, or an instruction to switch off pressure unit, for example, to create a high pressure, whereby wafer 450 is released from pillar field 420.

At S260, based on the image signal, according to some implementations, the control unit generates position data that represent information on a position of wafer 450, for example, with reference to chuck base 410. In some implementations the generating comprises calculation of position coordinates and/or angles. In some implementations the generating comprises submitting a plurality of measurement data to a statistical analysis. Position information, in some embodiments, comprises a lateral position with respect, for example, to axis 435 of lens system 464. Position information, in some embodiments, comprises orientation information of wafer 450 about lens axis 435. In some embodiments, position information comprises both, lateral position and rotational position. In some implementation, the position information is used in order to align any tool or mask according to the position of wafer 450, for example, for use in subsequent wafer processing acts.

As described above, FIG. 3A is a schematic representation of an exemplary image seen in use of processing apparatus 400 according to some embodiments. The image, in some implementations could, for example, be taken by camera 460 during an interval, when, at S220, source of light 445 is switched on to illuminate peripheral portion 440 of chuck base 410. Light from source of light 445 gets reflected by the wall surface of peripheral portion 440 of chuck base 410 and illuminates edge portion 455 of wafer 450 to throw a shadow. Thus, in some implementations, for lack of any other source of light, wafer 450 throws a shadow that, in the image detected at camera 460, appears as a dark field 350. However, some light from source of light 445 gets reflected by the wall surface of peripheral portion 440 to then pass edge portion 455 of wafer 450 and hit lens system 464 of camera 460 where, in some implementations, the light hits a charge coupled device or other light sensitive element. The charge coupled device thus detects light that passed wafer 450, wherein the detected light forms an image of a bright ring 340. Further, for lack of any illumination of a top surface of rim 415, rim 415, at camera 460 is seen as a dark ring 315 that surrounds bright ring 340 and dark field 350 and whose diameter fits within the field of view 466 of camera 460. At least one effect can be that, as described in more detail above with reference to FIG. 3A, a position of wafer 450 can be well determined, since the image taken by camera 460 has a high contrast of a shadow thrown by wafer 450 against light from source of light 445 provided in pillar field 420 below wafer 460. Accordingly, a tool for use in further working the wafer, for example, to cut away an edge portion of wafer 450, can be precisely set to wafer 460.

Figure 5:
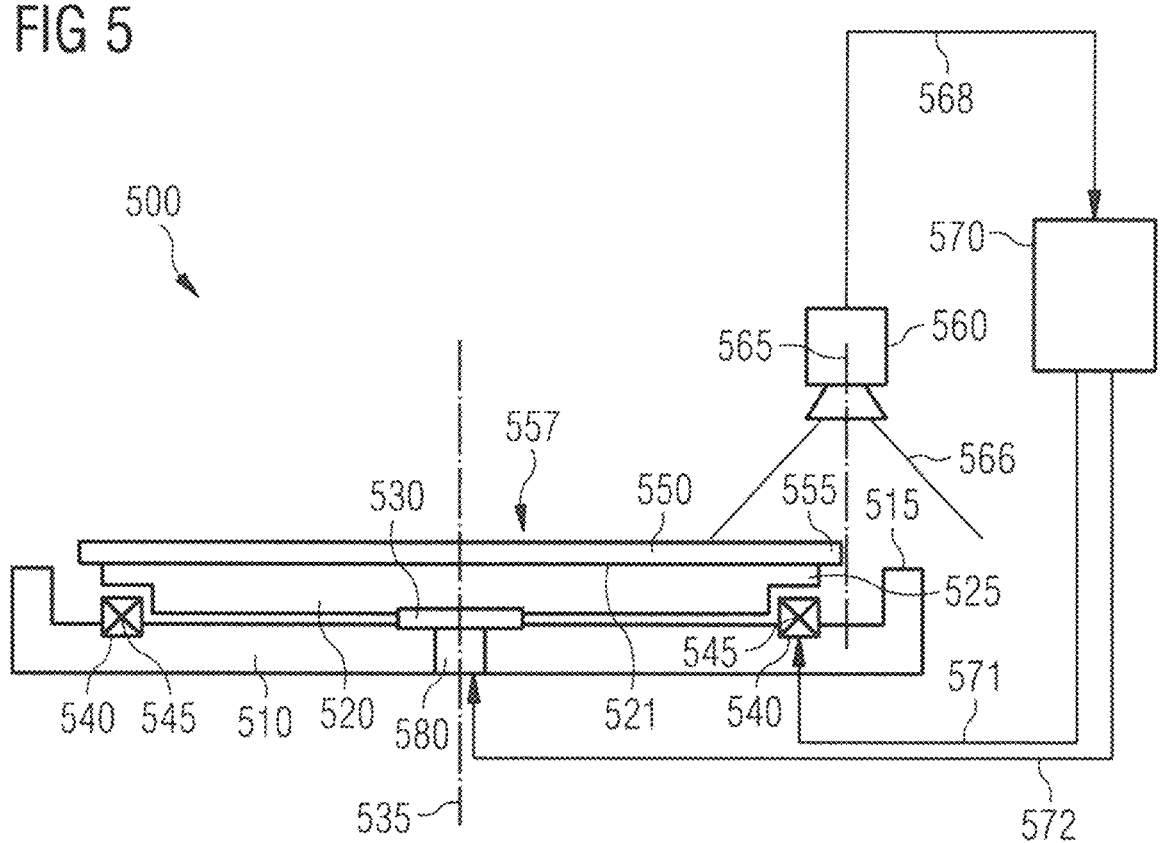
FIG. 5 is a diagram that illustrates a sectional side view of a processing apparatus according to some embodiments.

FIG. 5 is a diagram that illustrates a sectional side view of a processing apparatus 500 according to some embodiments. Processing apparatus 500 closely resembles processing apparatus 100 described above with reference to FIG. 1. More particularly, processing apparatus 500 comprises a chuck base 510 and a turntable 520. Processing apparatus 500 comprises a bearing 530 configured to bear turntable 520 on chuck base 510. In some embodiments, chuck base 510 has a rim 515 that, in some implementations approximately in a plane with a surface 521 of turntable 520, surrounds turntable 520.

In some embodiments, processing apparatus 500 comprises a drive unit 580. In some implementations, drive unit 580 is configured to receive a control signal and, based on the control signal, to move table 520. In some embodiments, turntable 520 provided with drive unit 580 is configured to rotate table 520 relative to chuck base 510 about a drive rotation axis 535. In some implementations, drive unit 580 is configured to laterally move table 520 relative to chuck base 510.

Table 520 is provided with a surface 521 configured to support a workpiece. A peripheral portion of turntable 520 forms a protrusion 525 that partially covers a peripheral recess 540 provided by chuck base 510. In some embodiments, peripheral recess 540 houses a source of light 545. For example, peripheral recess 540 houses a light emitting diode.

Further, processing apparatus 500 comprises a camera 560 having a lens system 564 with a field of view 566. In some embodiments, an axis 565 of lens system 564 is essentially perpendicular to chuck base 510 and meets peripheral recess 540. In some implementations, camera 560 comprises an image sensor and is configured to output a detect signal representative of light sensed by the image sensor. In some embodiments, image sensor is provided as a charge coupled device that is configured to output an image signal as a detect signal.

In some implementations, processing apparatus 500 comprises, or is coupled to, a control unit 570. More particularly, control unit 570 is selectively coupled to other components of processing apparatus 500. For example, control unit 570 is coupled, via a detect signal link 568, to camera 560. In some embodiments, control unit 570 is coupled, via a first control signal link 571, to source of light 545. Further, in some implementations, control unit 570 is coupled, via a second control signal link 572, to drive unit 580. As will be described in more detail below, in some embodiments control unit 570 is configured to receive the detect signal from camera 560, process the detect signal to derive a first control signal and to transmit the first control signal to source of light 545 In some embodiments, control unit 570 is configured to derive, based on the detect signal, a second control signal and to transmit the second control signal to drive unit 580.

Now, use of processing apparatus 500 according to some implementations will briefly be described, again, with respect to FIG. 2. It should be understood that the techniques of use described above with reference to processing apparatus 100 illustrated FIG. 1 and with reference to acts disclosed in the flow chart shown in FIG. 2 can essentially also applied to of processing apparatus 500 that is schematically depicted in FIG. 5.

At S205, a workpiece is provided on surface 521 of table 520. In some implementations, the workpiece can, for example, be a wafer 550 such as a silicon wafer that is used in manufacturing semiconductor devices. In an exemplary embodiment, wafer 550 has an essentially circular shape whose rotational symmetry is broken by a wafer flat. In some implementations, an edge portion 555 of wafer 550 can radially extend beyond protrusion 525 of turntable 520, while an edge of top surface 557 of wafer 550 faces lens system 564 of camera 560.

In some implementations, at S210, drive unit 580 is operated to adjust a position of turntable 520. In some embodiments, drive unit 580 moves turntable 520 with wafer 550 laterally with respect to chuck base 510. In some implementations, drive unit 580 rotates turntable with wafer 550 with respect to chuck base 510.

At S220, control unit 570 controls source of light 545 so as to illuminate peripheral recess 540. Light from source of light 545, some directly and some indirectly, in particular by reflection at a wall surface of peripheral recess 540, illuminates edge portion 555 of wafer 550. In particular, however, at least according to some implementations, no, or at least comparatively little, light from source of light 545 hits top surface 557 of wafer 550.

At S230, camera 560 detects light, for example, by using the charge coupled device comprised in camera 560, and outputs an image signal as a detect signal onto detect signal link 568 for transmission to control unit 570.

At S240, control unit 570 receives the image signal and processes the image signal. In some implementations, processing of the image signal generates at least a first control signal for use in control of light source 545. In some implementations, control unit 570 generates the second control signal based on the orientation information. In some implementations, processing of the image signal generates at least a second control signal for use in control of drive unit 580. In some implementations, control unit 570 generates the second control signal based on orientation information about an orientation of wafer 550 about drive rotation axis 535 and relative to chuck base 510.

In some implementations, at S250, control unit 570 transmits the first control signal, via first control signal link 571, to source of light 545. For example, the first control signal can represent a flag indicative of a switch operation such as an instruction to switch on source of light 545 or an instruction to switch off source of light 545.

In some implementations, at S250, control unit 570 transmits the second control signal, via second control signal link 572, to drive unit 580. For example, the second control signal can represent a flag indicative of a switch operation such as an instruction to switch on drive unit 580 or an instruction to switch off drive unit 580.

At S260, based on the image signal, according to some implementations, control unit 570 generates position data that represent information on a position of wafer 550, for example, with reference to chuck base 510. In some implementations the generating comprises calculation of position coordinates and/or angles. In some implementations the generating comprises submitting a plurality of measurement data to a statistical analysis. Position information, in some embodiments, comprises a lateral position with respect, for example, to drive rotation axis 535. Position information, in some embodiments, comprises orientation information of wafer 550 about drive rotation axis 535. In some embodiments, position information comprises both, lateral position and rotational position. In some implementation, the position information is used in order to align any tool or mask according to the position of wafer 550, for example, for use in subsequent wafer processing acts.

As discussed above with reference to FIG. 2, it should be understood that a sequence of acts described above with respect to FIG. 2 can be different according to different implementations. Further, in some implementations, some of the acts described above with reference to FIG. 2 are essentially performed simultaneously.

Figure 6A:
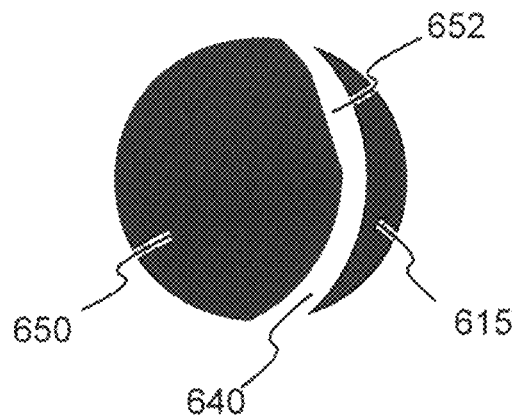
FIG. 6A is a schematic representation of an exemplary first image taken in use of a variant of a processing apparatus according to some embodiments.

FIG. 6A is a schematic representation of an exemplary first image taken in use of a variant of a processing apparatus according to some embodiments. The first image, in some implementations could, for example, be taken by camera 560 during an interval, when, at S220, source of light 545 is switched on to illuminate peripheral recess 540 of chuck base 510. In contrast to images discussed above with reference to FIG. 3A and FIG. 3B, where the field of view 166 of camera 160 covered all of wafer 150, peripheral recess 140 and at least a portion of rim 115, the field of view 566 of camera 560 covers merely a section of an edge portion of wafer 550, peripheral recess 540 and rim 515.

Light from source of light 545 gets reflected by the wall surface of peripheral recess 540 and illuminates edge portion 555 of wafer 550 to throw a shadow. Thus, in some implementations, for lack of any other source of light, wafer 550 throws a shadow that, in the first image detected at camera 560, appears as a dark field 650. However, some light from source of light 545 gets reflected by the wall surface of peripheral recess 540 to then pass edge portion 555 of wafer 550 and hit lens system 564 of camera 560 where, in some implementations, the light hits a charge coupled device or other light sensitive element. The charge coupled device thus detects light that passed wafer 550, wherein the detected light forms an image of a bright portion 640 of an illumination ring. Further, for lack of any illumination of a top surface of rim 515, a portion of rim 515, at camera 560 is seen as a dark portion 615 of a ring adjacent to bright portion 640 of the illumination ring and dark field 650.

The exemplary first image also shows a wafer flat 652. Thus, the first image includes sufficient information for control unit 570 to calculate a position of wafer 450 relative to chuck base 510.

Figure 6B:
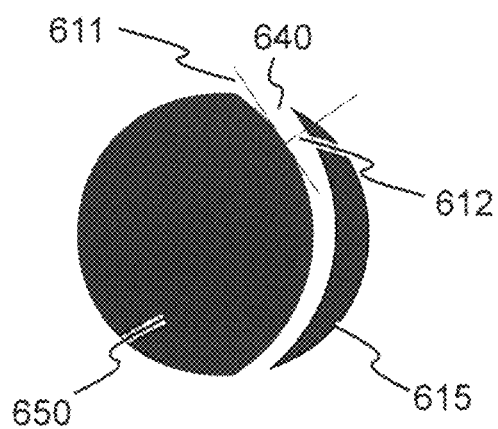
FIG. 6B is a schematic representation of an exemplary second image taken in use of a variant of a processing apparatus according to some embodiments.
Figure 6C:
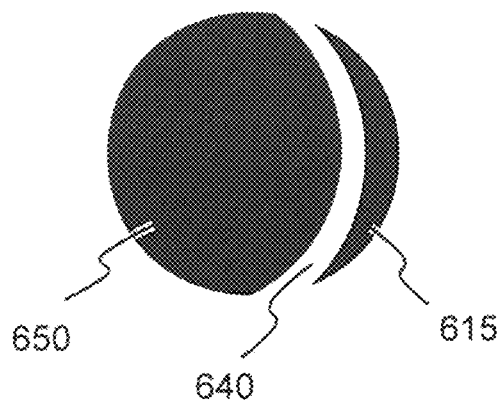
FIG. 6C is a schematic representation of an exemplary third image taken in use of a variant of a processing apparatus according to some embodiments.
Figure 6D:
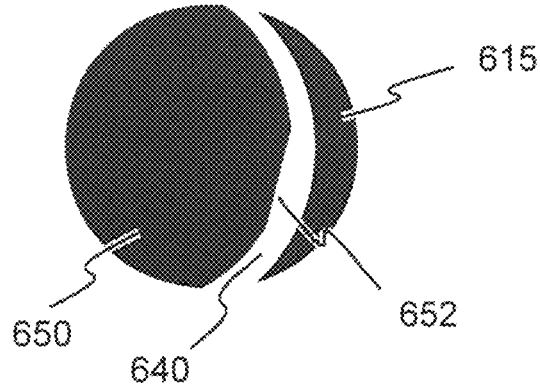
FIG. 6D is a schematic representation of an exemplary fourth image taken in use of a variant of a processing apparatus according to some embodiments.

FIG. 6B is a schematic representation of an exemplary second image taken in use of a variant of a processing apparatus according to some embodiments. In some implementations, between taking the first image shown in FIG. 6A and taking the second image shown in FIG. 6B, wafer 550 is rotated about drive rotation axis 535. Thereby, flat 652 was moved out of field of view 566 of camera 560. Unless wafer 550 is positioned concentrically on turntable 520, a radial distance varies. This is shown in FIG. 6B where, a line is drawn in a direction 612 that is perpendicular to a tangent 611 of wafer shadow 650. The varying distance depends on the position of wafer 550 on turntable 520. Given in formation on a polar position of turntable 520 relative to chuck base 510 at the time of taking the second image, using the second image, control unit 570 can thus determine the position of wafer 550 on turntable 520. Further images taken by camera 560 with turntable 520 at other polar angles about drive rotation axis 535 can be used to increase a precision of the calculation of the position of wafer 550 on turntable 520. For example, FIG. 6C is a schematic representation of an exemplary third image taken in use of a variant of a processing apparatus according to some embodiments, and FIG. 6D is a schematic representation of an exemplary fourth image taken in use of a variant of a processing apparatus according to some embodiments, wherein, in FIG. 6D flat 652 is, again, visible, since wafer 550 was rotated sufficiently far to move flat into the field of view of camera 560.

FIG. 7 is a diagram that illustrates a sectional side view of a processing apparatus according to some embodiments. Processing apparatus 700 comprises a chuck base 710 having a chuck table 720 with a table surface 721 configured to support a workpiece such as a wafer 750 (shown in FIG. 7 in the process of being set down, indicated by arrows 735, onto the table surface 721). In some embodiments, chuck base 710 has a rim 715. In some implementations, rim 715 is set lower than the table surface 721. In some implementations (not shown in FIG. 7), rim 715 surrounds table 720 approximately in a plane with the table surface 721.

A peripheral portion of chuck table 720 is provided with a recess 740. In some embodiments, peripheral recess 740 surrounds all of chuck table 720. In some embodiments, peripheral recess 740 is provided merely at selected rotational positions or angles as seen from a centre of the table surface 721. In some embodiments, peripheral recess 740 receives a source of light 745. For example, peripheral recess 740 houses a fluorescent tape and/or an organic light emitting diode foil as the source of light 745. In some embodiments, a light emitting surface 746 of the source of light 745 aligns to and/or is provided in a plane with the table surface 721.

Further, processing apparatus 700 comprises or can be coupled to a camera 760 with a field of view 766 (not drawn to scale). Some embodiments of camera 760 comprise a lens system 764. In some embodiments, an axis 765 of lens system 764 is essentially perpendicular to table surface 721. In some implementations, camera 760 comprises an image sensor and is configured to output a detect signal representative of light sensed by the image sensor. In some embodiments, the image sensor is provided as a charge coupled device that is configured to output an image signal as a detect signal.

In some embodiments, processing apparatus 700 comprises a drive unit (not shown) configured to receive a control signal and, based on the control signal, to move camera 760 above chuck base 710, in particular above chuck table 720 as is indicated in FIG. 7 by arrows 736 and 737 that, however, are only indicative of motion as such while a direction of motion relative to chuck surface 720 is inaccurately represented. It should be noted that, in some implementations, the motion of camera 760, is essentially in a plane parallel to chuck surface 720. In some embodiments, camera 760 can be configured to rotate relative to chuck base 710 about a rotational axis approximately perpendicular to table surface 720 and, in some implementations, approximately meeting a central portion of table surface 720 (for example, in FIG. 7, where arrows 735 are drawn). Camera 760 is thus configured to move relative to chuck base 710 and chuck table 720.

In some implementations, processing apparatus 700 comprises, or is coupled to, a control unit 770. More particularly, control unit 770 is selectively coupled to other components of processing apparatus 700. For example, control unit 770 is coupled, via a detect signal link 768, to camera 760. In some embodiments (not shown in FIG. 7), control unit 770 is coupled, via a first control signal link, to source of light 745. Further, in some implementations, control unit 770 is coupled, via a second control signal link 771 to camera 760.

In some embodiments control unit 770 is configured to receive the detect signal from camera 760, process the detect signal to derive a first control signal and to transmit the first control signal to source of light 745. In some embodiments, control unit 770 is configured to derive, based on the detect signal, a second control signal and to transmit the second control signal to camera 760. In some embodiments the control unit 770 is operative to control motion of the camera 760 above the table surface 721 supporting the wafer 750. In particular, control unit 770 can be operative to control a drive unit (not shown) so as to drive camera 760 to predetermined locations such that the light emitting surface 746 of the source of light 745 is at least partially in the field of view 766 of camera 760. Thus, an edge of wafer 750 put down on the chuck table's surface 721 can be inspected by camera 760 using light emitted from the source of light 745 at various portions of the chuck table 720 and passing an edge of the wafer 750 as described above with respect, for example, to embodiments illustrated in FIGS. 1, 4 and 5.

It should be understood that in accordance with the present disclosure the level of precision in determining the position of the workpiece on the chuck can be particularly high because of the contrast between backlight provided by the source of light essentially covered by the workpiece and light radiated from the source of light that passed the workpiece before hitting the camera or other image detector, however, without having been reflected by the surface of the workpiece to the extent that the surface provides a portion of the image "seen" by the camera.

Other embodiments are possible, in order to implement the concepts and techniques disclosed herein. For example, the person skilled in the art can provide a chuck configured to affix a wafer on the chuck, similar to embodiments discussed above with reference to FIG. 4, and provide a camera and/or other light sensitive device movably facing the chuck, in particular to track an edge portion of a wafer affixed to the chuck.

In an aspect the invention encompasses a method for use in handling a wafer, in particular, for use in processing the wafer. The method comprises providing the wafer on a receptacle such as a chuck, shining a light at an edge of the wafer, and, based on light that passed the edge of the wafer, processing the wafer on the receptacle. In some implementations, the edge of the wafer comprises an edge formed by a hole in the wafer and, thus, surrounded by the wafer. At least one effect can be that the light passing by the edge of the wafer is not reflected by a surface of the wafer. Therefore, the surface of the wafer is essentially kept from affecting the detected light. The less light is reflected by the surface of the wafer, the larger is a contrast in an image taken of an edge portion of the wafer, where light that passed the edge contrasts with a shadow thrown by the wafer edge portion. The image can be used to measure the wafer. For example, in a case where the wafer has an essentially circular shape, a centre can be determined. In a case where the wafer is not circular but has another shape, for example, a rectangular shape such as a quadratic shape, a trapezoid shape, a triangular shape or another geometric shape, or a complex or an arbitrary shape, for example, a weight centre and/or a boundary length can be determined. Information gathered by analysis of the image can be used in processing the wafer, wherein processing includes one or more acts in a group of acts comprising: lithography, inking, laminating, mounting, thinning, cutting, optical inspection.

Some embodiments comprise using a light sensitive element to detect light that passed the edge of the wafer to form a detection signal. Some embodiments comprise controlling, based on the detection signal, a position of the wafer relative to the receptacle. Some embodiments comprise deriving, from the detection signal, position information representative of the position of the wafer relative to the receptacle. Some embodiments comprise, based on the detection signal, generating position information representative of a position of the wafer on the receptacle. Some embodiments comprise using the position information to control alignment of a processing tool.

In some embodiments the shining the light comprises reflecting the light at a surface of the receptacle prior to passing the light by the edge of the wafer. At least one effect can be that a source of light does not need to be exposed to a tool such as a laser beam that is used to work the edge of the wafer, for example, to cut the wafer.

Some embodiments comprise operating a light emitting diode to shine the light. Some embodiments comprise varying a wavelength of the light. At least one effect can be that a contrast between light and shadow can be detected more precisely. In some embodiments the method comprises moving the detector while keeping the wafer fixed. Some embodiments comprise lifting the wafer above the receptacle. Some embodiments comprise shining the light from below the wafer.

In some embodiments the receptacle is provided as a plate such as a support table of a chuck. At least one effect can be that the wafer can be submitted to lateral displacement and/or rotation in a plane without changing a vertical distance between an edge surface portion of the work piece with respect to at least on of the following: the source of light, the detector and a tool configured to work the wafer.

In some embodiments the plate extends above a peripheral recess to accept a source of light. At least one effect can be that the source of light can be provided and/or configured to shine into the recess. In some embodiments the providing the wafer comprises positioning the wafer on the plate, for example, in accordance to a predetermined position information. In some embodiments, the predetermined position information comprises a central location of the wafer on the plate. In some implementations the wafer is positioned, for example, so as to extend beyond the edge of the plate. At least one effect can be that the source of light can be configured to shine light so as to pass by the edge of the wafer.

In some embodiments a surface of the plate is provided with a recess that includes a source of light. In some embodiments the providing the wafer comprises positioning the wafer so that an edge of the wafer extends over a portion of the recess. In some implementations, at least a portion of the receptacle is transparent and the source of light is provided so as to shine through the transparent portion of the receptacle onto the edge of a wafer supported by the receptacle. In some embodiments, the receptacle is provided with an opening and the source of light is provided so as to shine through the opening onto the edge of a wafer supported by the receptacle.

In some embodiments, for example, rather than providing the source of light with the receptacle, the source of light is attached to the wafer. In some embodiments at least an edge portion of wafer is provided with a substrate such as a carrier foil that is configured to emit light. For example, in some implementations a fluorescent foil or an organic light emitting diode foil is attached to the wafer, for example, to provide a carrier for the wafer. In use, seen form an image taking device facing an edge portion the wafer, the light from the foil appears from behind the wafer and thus provides for a high contrast image.

In some implementations, the receptacle comprises a turntable of a chuck and the method includes rotating the turntable relative to a chuck base. In some implementations, the method comprises moving a spatial field of view of the light sensitive element and the wafer relative to one another. In some embodiments the method comprises rotating the wafer while keeping the spatial field of view of the detector fixed. At least one effect can be that a movement of the wafer, e.g., the wafer, about its centre can be accomplished with high accuracy. In some embodiments the wafer has a circular shape apart from a portion of the wafer, for example, a wafer flat or a notch, where the edge of the wafer recedes inside a circle defined by the circular shape. Some embodiments comprise aligning the wafer responsive to position information and cutting the wafer.

In another aspect the invention encompasses an apparatus for use in processing a wafer. The apparatus comprises a receptacle configured to receive the wafer during a processing act. Some embodiments comprise a light sensitive element configured to form a detection signal based on light that passed the edge of the wafer to hit the light sensitive element. Some embodiments comprise a light port configured to couple to a source of light and to shine light of the source of light at an edge of the wafer. In some implementations the receptacle is provided as a chuck having an essentially fixed chuck base and a support table or support plate. In some implementations the support table is movable. For example, the support plate can be provided as a turntable.

Some embodiments comprise a control unit configured to control, based on the detection signal, a position of the wafer relative to a fixed portion of the receptacle such as a chuck base. In some embodiments the control unit is configured to derive, based on the detection signal, position information representative of the position of the wafer relative to the receptacle. In some embodiments the control unit is configured to control an alignment of the wafer responsive to position information. At least one effect can be that the wafer can be aligned for accurate cutting of the wafer, for example, to cut away an edge of the wafer. In some embodiments the control unit is configured to a rotationally align a wafer that has a circular shape apart from a portion of the wafer where the edge of the wafer recedes inside a circle defined by the circular shape. In some embodiments, the control unit is configured to derive, based on the detection signal, position information representative of the position of the wafer relative to the receptacle. Some embodiments comprise a drive unit configured to move, for example, to rotate the plate while keeping a spatial field of view of the detector fixed, wherein the control unit is configured to control the drive unit. In some embodiments, the apparatus is configured to move the light sensitive element relative to the receptacle.

In some embodiments the receptacle is provided as a plate. In some embodiments the plate has planar surface. In some embodiments the plate extends above a peripheral recess configured to house the source of light. At least one effect can be that the wafer can be positioned on the plate so as to extend beyond the edge of the plate. In some embodiments a surface of the plate is provided with a recess that includes the source of light. At least one effect can be that the wafer can be positioned on the plate so that an edge of the wafer extends over a portion of the recess. In some embodiments the drive unit is configured to rotate the plate while keeping a spatial field of view of the detector fixed. At least one effect can be that the wafer can be a wafer essentially having a circular shape.

In some embodiments the receptacle comprises a surface configured to reflect the light from the light port prior to passing the light by the edge of the wafer. For example, where the receptacle comprises a chuck base, the chuck base can be provided with a reflective portion configured to reflect light prior to the light passing a wafer supported by the chuck's support table. In some embodiments the light port comprises a light emitting diode as source of light operative to shine the light. In some embodiments the light port is configured to vary a wavelength of the light shone on the edge of the wafer.

Some embodiments comprise a drive unit configured to move the detector while keeping the wafer fixed.

In another aspect the invention encompasses a computer readable medium storing instruction code thereon that, when executed, causes one or more processors to perform acts of a method for use in handling a wafer. The method comprises providing the wafer at a receptacle, shining a light at an edge of the wafer, and using a light sensitive element to detect light that passed by the edge of the wafer to form a detection signal. In some embodiments the medium comprises code to cause control of an alignment of the wafer responsive to position information derived from the detection signal.

As used herein, like terms refer to like elements throughout the description. It is to be understood that the features of the various embodiments described herein may be combined with each other, unless specifically noted otherwise. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. It is intended that this invention be limited only by the claims and the equivalents thereof.

The implementations herein are described in terms of exemplary embodiments. However, it should be appreciated that individual aspects of the implementations may be separately claimed and one or more of the features of the various embodiments may be combined. Exemplary implementations/embodiments discussed herein may have various components collocated; however, it should be appreciated that the components of the arrangements may be combined into one or more apparatuses. In some instances, well-known features are omitted or simplified to clarify the description of the exemplary implementations. While a particular feature of the disclosure may have been disclosed with respect to only one of several implementations, such feature may be combined with one or more other features of the other implementations as may be desired and advantageous for any given or particular application.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques', for instance, may refer to one or more devices, apparatuses, systems, methods, articles of manufacture, and/or computer-readable instructions as indicated by the context described herein.

As used herein, the articles 'a' and 'an' should generally be construed to mean 'one or more,' unless specified otherwise or clear from context to be directed to a singular form.

As used herein, the terms 'coupled' and 'connected' may have been used to describe how various elements interface. Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, the word 'continuous' is to be understood in context with an implemented mode of operation. For example, if a system is understood to operate in a clocked mode, the wording 'continuous operation' can mean an operation in the clocked mode while the wording does not address operation in another mode. For another example, if a system is described to operate in an active mode and not to operate in an inactive mode, 'continuous operation' can mean continuous operation in the active mode and no operation while the system is in the inactive mode. As used herein, the wording 'to perform continuously' is not necessarily to be understood as unconditionally 'always'. Conditions such as a prerequisite for a certain continuous mode of operation can be defined to be met as a requirement for a continuous performance. The continuous performance can be defined to last as long as the conditions are met. One condition can be activation of a continuous mode of operation having a predetermined condition for deactivation such as completion of a predetermined duration.

As used herein, various links, including communications channel, connecting the elements can be wired or wireless links, or any combination thereof, or any other known or later developed element(s) that is capable of supplying and/or communicating data to and from the connected elements.

As used herein, the terms 'determine', 'calculate' and 'compute', and variations thereof, are used interchangeably and include any type of methodology, process, mathematical operation or technique. As used herein, the wording 'A coupled to B' means a capacity of A to provide C to B, provided that B is ready to accept C, wherein C, as the case may be, is a signal, power, message or other abstract or concrete thing as described in the context of the wording.

As used herein, directional terminology, such as 'top', 'bottom', 'front', 'back', 'leading', 'trailing', etc., is used with reference to the orientation of the figure(s) being described.

As used herein, terms such as 'first', 'second', and the like, are also used to describe various elements, regions, sections, etc. and are also not intended to be limiting.

What is claimed is:

1. A method comprising:
   placing a wafer on a turntable of a receptacle;
   shining light from a light port of a chuck base of the receptacle at an edge of the wafer so that the light passes by the edge of the wafer, wherein the light port emits the light from a source of light located at an opening in a surface of the chuck base, and wherein the light port is located underneath the turntable and the wafer; and
   processing the wafer on the receptacle based on the light that passed by the edge of the wafer and that is received by a light sensitive element.

2. The method of claim 1, wherein the chuck base comprises a rotation axis and a rim along a circumference of the chuck base, and wherein the light port is located between the rim and the rotation axis.

3. The method of claim 2, wherein the rim extends towards the wafer.

4. The method of claim 3, wherein the light port is located closer to the rim than to the rotation axis.

5. The method of claim 4, wherein the light port comprises a plurality of light ports, each light port spaced apart equidistantly from another light port.

6. The method of claim 1, wherein processing the wafer comprises:
   detecting, by the light sensitive element, the light that passed by the edge of the wafer;
   generating, by a controller, position data representing information about a position of the wafer based on the detected light;
   instructing, by the controller, a driver to move the turntable to an adjusted position; and
   moving, by the driver, the turntable and thereby the wafer to the adjusted position.

7. A method comprising:
   placing a wafer on a receptacle, wherein the wafer has an upper long side and a lower long side, and wherein the upper long side is connected to the lower long side by an outer circumferential edge;
   shining light from a light port at the outer circumferential edge of the wafer so that the light passes by the outer circumferential edge of the wafer, wherein the light port is located at a surface of the receptacle; and
   processing the wafer on the receptacle based on the light that passed by the outer circumferential edge of the wafer and that is received by a light sensitive element.

8. The method of claim 7, wherein the light port is an opening located in the surface of the receptacle.

9. The method of claim 7, wherein the receptacle comprises a chuck base.

10. The method of claim 9, wherein the receptacle further comprises a turntable arranged between the wafer and the chuck base.

11. The method of claim 9, wherein the chuck base comprises a rotation axis and a rim along a circumference of the chuck base, and wherein the light port is located between the rim and the rotation axis.

12. The method of claim 11, wherein the rim extends towards the wafer.

13. The method of claim 12, wherein the light port is located closer to the rim than to the rotation axis.

14. The method of claim 13, wherein the light port comprises a plurality of light ports, each light port spaced apart equidistantly from another light port.

15. The method of claim 7, wherein the light port emits light of a light emitting diode.

16. The method of claim 7, wherein processing the wafer comprises:
   detecting, by the light sensitive element, the light that passed by the outer circumferential edge of the wafer;
   generating, by a controller, position data representing information about a position of the wafer based on the detected light;
   instructing, by the controller, a driver to move the receptacle to an adjusted position; and
   moving, by the driver, the receptacle and thereby the wafer to the adjusted position.

17. The method of claim 1, wherein the receptacle comprises a rotation axis, wherein the light port is located at a first distance from the rotation axis, wherein an outer circumferential edge of the wafer is located at a second distance from the rotation axis, and wherein the second distance is further away from the rotation axis than the first distance.

18. The method of claim 1, wherein an outer circumferential edge of the turntable forms a protrusion.

19. The method of claim 18, wherein the protrusion covers the light port in plan view.

* * * * *